TABLE II-continued

|  | A | B | C | D | D |
|---|---|---|---|---|---|
| Expansion ($\times 10^{-7}/°C$.) | 95 | 70 | 62 | 75 | 110 |
| Softening Point (°C.) | 440 | 485 | 520 | 538 | 540 |

Inasmuch as the Na$_2$O content was the principal variable, the content thereof has been employed as the abscissa of the appended graph, FIG. 1, wherein the coefficients of thermal expansion and the softening points are plotted for all the compositions (curves a and b, respectively). Curve a illustrates that the coefficients of thermal expansion of the sealing glass and the capillary glass are substantially identical but each of the intermediate glasses has a lower coefficient. Although this phenomenon has not been rigorously explained, it is believed to be caused via variations of coordination of boron atoms with Na$_2$O content, which has been termed the "boron anomaly", as reported by Briscoe and Warren, *Journal American Ceramic Society*, 21, 287 (1936). This phenomenon is also expressed by the tendency to phase separate which is evidenced in all compositions containing about 5-25% Na$_2$O [Shaw and Uhlman, *Journal American Ceramic Society*, 51, 379 (1968)].

Whatever the explanation, it is evident from the presence of the minimum in the coefficient of thermal expansion values that fracture of the capillaries will occur through thermo-mechanical stress if Na$^+$ ions are removed from the capillary glass. This action can take place through sodium ion migration by exchange with hydrogen ions, either through the contact with the low Na$_2$O content sealing glass of higher hydroxyl ion content, or by the presence of crystalline interfacial material occasionally formed by devitrification, hydration, or some process-related contamination on the sealing glass surface. Curve b demonstrates that the loss of some Na$_2$O from the capillary glass can yield glasses which have viscosities as high, if not higher, than the capillary glass such that stresses cannot be annealed out at the battery operation temperature of 300° C. As was observed previously, Na$^+$ ion migration may occur when the temperature is relatively high as, for example, during the sealing process or, if a long period of time is allowed, during the operating life of the battery, especially where spots of local over-temperature develop. Hence, the loss of Na$^+$ ions from the capillary glass presents a very real problem with regard to the life of the battery.

The present invention alleviates that problem through the use of alkali metal borate sealing glasses exhibiting coefficients of thermal expansion closely compatible with those of the capillary glasses and containing alkali metal ions other than Na$^+$ ions, such that an interdiffusion by exchange of alkali metal ions can take place between the capillary glass and the sealing glass, thereby alleviating or eliminating other undesirable processes.

FIG. 2 schematically represents the changes in the coefficient of thermal expansion (R.T.-250° C.) exhibited by K$_2$O-B$_2$O$_3$ and Cs$_2$O-B$_2$O$_3$ containing systems where the K$_2$O and Cs$_2$O are varied between 5-25% on the molar basis, those values representing the alkali metal oxide contents of the sealing glass and capillary glass, respectively. The minimum in the coefficient of thermal expansion characteristic of the sodium borate glasses leading to the capillary brittleness was discussed above and demonstrated in FIG. 1. FIG. 2 illustrates that the minimum in the K$_2$O-B$_2$O$_3$ glass system is much less pronounced and is essentially absent in the Cs$_2$O-B$_2$O$_3$ glasses. The curve generated by the changes in coefficients of thermal expansion exhibited by glasses having compositions within the Rb$_2$O-B$_2$O$_3$ system falls between the two curves of FIG. 2.

Accordingly, the exchange of Na$^+$ ions via interdiffusion from the capillary glass, with K$^+$, Rb$^+$, and/or Cs$^+$ ions from a borate-based sealing glass containing such ions, can take place with relatively little variation in the coefficient of thermal expansion between the sealing glass and capillary glass. In general, glass compositions containing at least two different alkali metal ions exhibit greater stability with respect to phase separation and/or devitrification and manifest higher electrical resistivity (the "mixed alkali effect"). In summary, then, a tight, mechanically-stable seal can be made between two glasses containing different alkali metal ions.

Accordingly, glasses operable as sealing glasses in the present invention will have base compositions within the general R$_2$O-B$_2$O$_3$ system and consist essentially, expressed in mole percent on the oxide basis as calculated from the batch, of about 3-30% R$_2$O and 60-95% B$_2$O$_3$, wherein R$_2$O consists of K$_2$O, Rb$_2$O, Cs$_2$O, and mixtures thereof and wherein, optionally, Al$_2$O$_3$ may be substituted for up to one-half of the B$_2$O$_3$ content on a molar basis. Minor additions of compatible materials, e.g., SiO$_2$, Na$_2$O, alkaline earth metal oxides, Cl, and F, may be included in the base composition to improve the melting and forming qualities of the glass and/or to modify the physical properties thereof. Moreover, the presence of Na$_2$O in the composition is important. The molar ratio R$_2$O:Na$_2$O determines the viscosity of the glass whereas the total alkali metal oxide content (R$_2$O+Na$_2$O) governs the thermal expansion of the glass. Based upon those two factors, the Na$_2$O level ranges about 0-20 mole percent. The content of SiO$_2$ will generally not exceed 10%, the total of the alkaline earth metal oxides will not exceed 5%, and individual amounts of Cl and F will commonly be less than 5%. Nevertheless, the total of all such extraneous additions will not exceed 30 mole percent and, most desirably, will be held below 20%. Stated in another manner, the sum of R$_2$O+B$_2$O$_3$ will constitute at least 70% of the total composition.

From thermal expansion considerations, a Cs$_2$O-containing glass would be the most desirable. Unfortunately, however, the cost of cesium-containing batch materials is very high. Rubidium-containing materials suitable as batch ingredients are even more costly. Consequently, practical considerations have dictated the preferred compositions to hold the Cs$_2$O content at a low level and to incorporate other alkali metal oxides, such as K$_2$O in addition to Cs$_2$O or to Na$_2$O. Where the glasses are to be employed in the sodium-sulfur battery, the total R$_2$O content will be limited to about 20% and Cs$_2$O-Na$_2$O combinations are preferred because of the low diffusion coefficient of the cesium ion. This factor permits the formation of a very thin interdiffusion layer between the glasses which, as has been explained above, is highly desirable. Potassium ion-containing glasses are preferred for such non-battery applications as sealing to conventional soda lime glass. Such glasses, when containing cesium, are also useful in making seals with components of potassium-sulfur batteries (as opposed to sodium-sulfur batteries). The use of K$^+$ ion-containing sealing glasses in sodium-sulfur batteries may lead to an

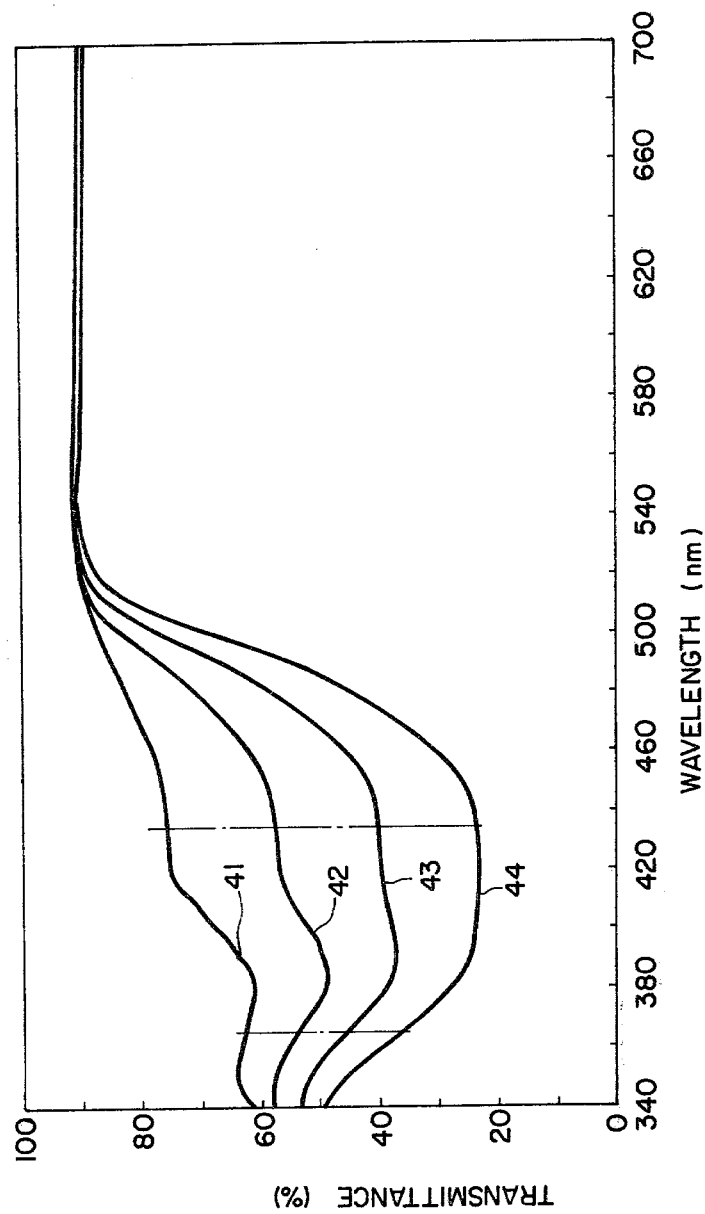

METHOD OF PRODUCING COLOR FILTERS

BACKGROUND OF THE INVENTION

The present invention relates to a method of producing color filters by forming a color filter array directly on a rugged substrate consisting, for example, of solid state imagers.

According to the conventional methods of producing color filters, a photosensitive material is coated on a flat substrate made of, for example, a glass, the photosensitive material is exposed through a mask of a predetermined pattern, the development is effected to form patterns, and the patterns are dyed with dyes. The thus obtained substrate with filter has been used being placed on the solid state imagers. With the above-mentioned method, however, when the color filter of fine patterns is placed on small solid state imagers, the thickness of the substrate or the deviation in position when the color filter is being placed makes it difficult to increase the resolution of the camera tube.

If it is attempted to directly form the color filter on the substrate consisting of solid state imagers having rugged surfaces, the ultraviolet rays which are vertically incident upon the substrate during the step of exposure are irregularly reflected through the rugged or stepped portions; the ultraviolet rays proceed in parallel with the substrate up to the inner side of the patterns that are to interrupt the ultraviolet rays, making it difficult to properly shape the patterns. This state is illustrated below with reference to FIG. 1. Ultraviolet rays 2 transmitted through a transparent glass portion 6 of an exposure mask 1 are reflected by a tilted surface 3 of a substrate 7 located beneath the mask 1, and are introduced into a photosensitive resin 5 beneath a opaque portion 4 of the mask 1, preventing the photosensitive resin from being shaped into a predetermined pattern. Because of these reasons, it is difficult to form color filters of fine patterns directly on the solid state imagers.

LIST OF PRIOR ART (37 CFR 1.56(a))

The following references are cited to show the state of the art.
Japanese Published Examined Patent Application No. 51-37562
Japanese Published Examined Patent Application No. 52-17375

SUMMARY OF THE INVENTION

The object of the present invention is to provide a method of producing color filters of fine patterns on a substrate having rugged surfaces.

Another object of the present invention is to provide a method of producing color filters comprising;

a step for forming a photosensitive film by coating, on a substrate, a mixture of a light-absorbing material which absorbs light and which can be removed with a solvent and a photosensitive material;

a step for irradiating light onto the photosensitive film through a predetermined pattern;

a step for removing dissolvable portions of the photosensitive film and the light-absorbing material from the photosensitive film which remains on the substrate; and a step for dyeing the photosensitive film into any desired color.

BRIEF DESCRIPTION OF THE DRAWINGS

FIGS. 2, 3, 4 and 5 are views for illustrating the present invention; and

DESCRIPTION OF THE PREFERRED EMBODIMENTS

The feature of the present invention is to effect the exposure and development using a photosensitive resin which contains a light-absorbing material. According to the conventional art, the photosensitive resins are usually blended with a sensitizer having good transmittance. In the present invention, on the other hand, problems inherent in the conventional art are solved by adding a light-absorbing material.

According to the method of the present invention, the light which is reflected toward the photosensitive resin is absorbed or weakened by the light-absorbing material, and is so drastically attenuated that the photosensitive resin is very less polymerized, making it possible to accurately form patterns which are substantially corresponding to an exposure mask. Examples of the light-absorbing material include direct dyes, acid dyes, basic dyes, mordant dyes, reactive dyes, and the like. The light-absorbing material, however, must be capable of absorbing part of the light of wavelengths ranging from 350 to 450 nm. Furthermore, the light-absorbing material must be capable of being dissolved in the photosensitive resin and must be capable of being removed after patterns have been formed so that the spectral transmittance of the filter is not deteriorated.

Figure 1:
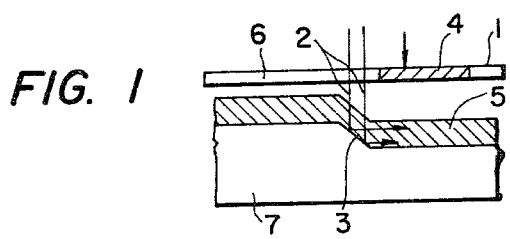
FIG. 1 is a view for illustrating the conventional technique.
Figure 2:
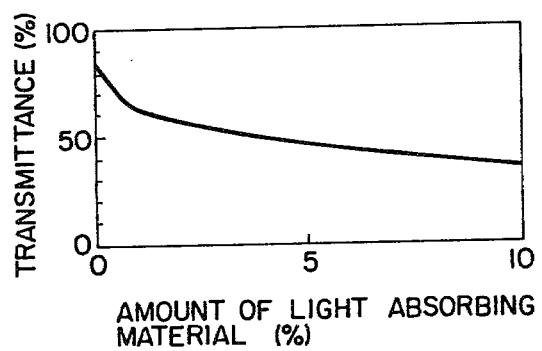
Figure 3:
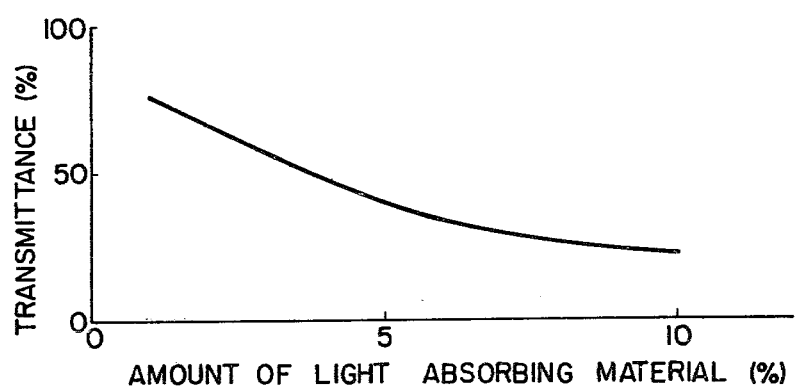

FIG. 2 shows the transmittance of ultraviolet ray of 365 nm when a Tartrazine (trade name, 3-carboxy-1-(p-sulfophenyl)-4-(p-sulfophenylazo)-5-hydroxy pyrazole) which is an acid dye having absorption characteristics in the ultraviolet regions, is added to a negative-working photoresist (photoresist of the type of gelatin-ammonium dichromate) which is usually used as a water-soluble photoresist. In this case, the thickness of the film is 1 $\mu$m. As will be obvious from FIG. 2, the transmittance of ultraviolet rays is drastically reduced by the addition of a very small amount of Tartrazine which is a light-absorbing material to the gelatin. The amount of Tartrazine is expressed by percent by weight with respect to the gelatin. FIG. 3 shows the transmittance of 435 nm.

The same effects are also observed in this case.

FIG. 4 shows spectral characteristics of a film prepared by adding Tartrazine to the photoresist of the type of gelatin-ammonium dichromate, in which curves 41, 42, 43 and 44 represent transmittances when Tartrazine is added in an amount of 1% weight (with respect to gelatin, the same holds true hereinafter), 3% by weight, 5% by weight, and 10% by weight, respectively.

The light-absorbing material should be added in such an amount that the transmittance of ultraviolet rays irradiating the photosensitive resin is smaller than 80% but is larger than 20%, and more preferably in such an amount that the transmittance is smaller than 75% but is larger than 40%. The operability becomes poor when the transmittance is smaller than 20%. Therefore, the amount of the light-absorbing material actually added will vary depending upon the wavelengths of the ultraviolet rays and the kind of light-absorbing materials. For instance, when the photosensitive resin is to be irradiated with ray of a wavelength of 435 nm, the Tartrazine should be added to the photosensitive resin preferably in amount of 0.5% by weight (with respect to gelatin) to 10% by weight, and more preferably in an amount of 1% by weight to 5% by weight.

In addition to Tartrazine, examples of the light-absorbing material include the following:

As acid dyes;
Fluorescein sodium salt (Color Index No. (hereinafter abbreviated as C.I. No.) 45350);
Orange G (C.I. No. 16230, sodium 7-hydroxy-8-phenylazo-1,3-naphthalene disulfonate);
Orange I (C.I. No. 14600, 4-(p-sulfophenylazo)-1-naphthol);
Orange II (C.I. No. 15510);
Acid Light Yellow 2G (C.I. No. 18965);
Kayanol Yellow N5G (trade name, produced by Nippon Kayaku Co., Ltd.);
Kayanol Yellow NFG (trade name, produced by Nippon Kayaku Co., Ltd.); and
Suminol Fast Yellow G (produced by Sumitomo Chemical Co., Ltd.).

As basic dyes;
Acridine Yellow (C.I. No. 46025, 2,7-dimethyl-3,6-diaminoacridine hydrochloride);
Chrysoidine (C.I. No. 11270, 2,4-diaminoazobenzene);
Acridine Orange (C.I. No. 46005, zinc double chloride of 3,6-bis(N,N-dimethylamino)-acridine hydrochloride); and
Yellow 3G-N (trade name of Mitsubishi Chemical Co.).

As direct dyes;
Direct Pure Yellow 5G (C.I. No. 13920, p-(6-methyl-7-sulfobenzo-2-thiazolyl)-phenylazoacetoacetanilide);
Brilliant Yellow (C.I. No. 24890); and
Chrysophenine G (C.I. No. 24895).

As mordant dyes;
Chrome Yellow (C.I. No. 14095, sodium 2-(3'-carboxy-4'-hydroxyphenylazo)-6-naphthalene sulfonate).

As reactive dyes;
Brilliant Yellow 7-GL (trade name of Mitsubishi Chemical Co.);
Brilliant Yellow GL (trade name of Mitsubishi Chemical Co.);
Mikacion Yellow GRS (trade name of Mitsubishi Chemical Co.); and
Drimarene Yellow Z-RL (trade name of Sandoz Co.).

The above-mentioned dyes are all soluble in water.

Even when these light-absorbing materials are added, the photosensitive resin does not almost lose adhesiveness or resistance against chemicals.

The photosensitive material should desirably be soluble in water. The present invention employs a widely known photosensitive material composed of a high molecular substance such as gelatin, polyvinyl alcohol, or the like, and a crosslinking agent such as ammonium dichromate, bisazide, or the like.

Figure 5:
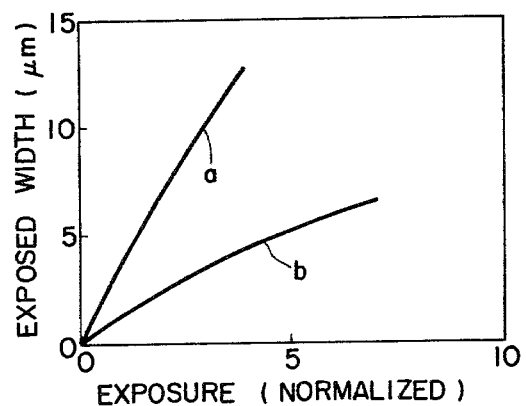

Below are mentioned the results when the resin coated on a solid state imager having rugged surface composed of aluminum is exposed to the light through mask. FIG. 5 illustrates a relation between the width which is sensitized by the light that is reflected from beneath the exposure mask and the quantity of exposure. A curve a represents the case when the light-absorbing agent is not added, and a curve b represents the case when Tartrazine which is a light-absorbing agent is added in an amount of 3% with respect to gelatin. As will be obvious from FIG. 5, under the equivalent exposure (to equivalently sensitize the photoresist, the effect of the light-absorbing agent must be taken into consideration because it usually works to reduce the sensitivity), the region sensitized in the opaque portion of the mask pattern due to the reflected light is very narrowed when the light-absorbing agent is added, and the dimensional precision of pattern is very little deteriorated by the light reflected by the tilted surfaces. The quantity of exposure in FIG. 5 has the following meaning. The photocrosslinking reaction in the negative-working photoresist proceeds with exposure. The photoresist becomes insoluble in the developing liquid, so that a film remains. The thickness of the film increases with the increase in the quantity of exposure. As the quantity of exposure exceeds a predetermined value, the thickness becomes nearly in agreement with the thickness when the photoresist was coated. A minimum quantity of exposure at which the coating of photoresist is all sensitized to form a film is generally referred to as a minimum required exposure quantity and is used as a unit of exposure quantity. The exposure of FIG. 5 is thus defined.

The effect of the light-absorbing agent is illustrated below from the standpoint of actually handling the photo-sensitive resin. The negative-working photoresist undergoes the crosslinking and becomes insoluble in the developing liquid. When the degree of crosslinking is small, however, the film is extremely swollen or is peeled off. To prevent the swelling or peeling during the step of developing, therefore, the exposure is usually excessively performed. The quantity of exposure should usually be two to three folds. With reference to the effects of light-absorbing agent of FIG. 5 in which the quantity of exposure is three folds, the width sensitized by the reflected light is reduced to about one-fourth contributing to the remarkable improvement in the precision. Thus, it is made possible to form fine patterns.

The light-absorbing material is removed by solvent from the photosensitive film simultaneously with the development of the photosensitive film, or before or after the development of the photosensitive film. Namely, the light-absorbing material may be removed before, simultaneously with, or after, the development provided the exposure has been completed. When the photosensitive resin of the type of gelatin is used, the development is usually carried out in hot water. Therefore, when the light-absorbing material which can be removed with water is added to the photosensitive resin of the type of gelatin, it is allowed to remove the light-absorbing material simultaneously with the development.

The present invention further provides a method of removing the light-absorbing material with weakly alkaline water. When it is attempted to remove the light-absorbing material immediately after it has been mixed into the photosensitive film, the light-absorbing material can be completely removed. However, when the light-absorbing material is left to stand in the photosensitive film for a while, it will not be completely removed causing the photosensitive film to be colored to a slight degree. The color adversely affects the spectral transmittance of the color filter. To practically produce fine color filters, the operation such as focusing must be precisely carried out requiring sufficient periods of time. The film, however, will be colored as mentioned above when extended periods of time are lapsed. It is therefore recommended to remove the light-absorbing material from the photosensitive film using a weakly alkaline aqueous solution having a pH value of preferably from 7.1 to 12.0, and more preferably having a pH value of from 9.2 to 12.0. The alkaline aqueous solution having a pH value in excess of 12 causes the film to be peeled off. The pH value therefore should not be greater than 12.

The film will be easily peeled off when the temperature of the weakly alkaline aqueous solution is high. On the other hand, the development is usually carried out in hot water. It is not, therefore, desirable to effect the developing and the removal of light-absorbing material simultaneously using the developing solution as a hot and weakly alkaline aqueous solution. It is recommended to remove the light-absorbing material with weakly alkaline water of room temperature after the developing has been effected.

Examples of the weakly alkaline aqueous solution will include ammonia water, aqueous solution of amine, aqueous solution of alkali hydroxide, aqueous solution of carbonates, aqueous solution of an alkali metal salt of weak acid. For example, aqueous solutions are employed such as of tetramethyl ammonium hydroxide, pyridine, diethanol amine, sodium acetate, sodium carbonate, sodium hydrogen carbonate, sodium hydroxide, and the like.

The photosensitive film from which is removed the light-absorbing material exhibits quite the same absorption spectrum as that of the photosensitive film which does not contain light-absorbing material but which is exposed and developed.

The photosensitive film from which has been removed the light-absorbing material is dyed by a conventional method, for example, by a method disclosed in Japanese Patent Publication No. 52-17375, to obtain a color filter having fine patterns.

Japanese Patent Publication No. 51-37562 discloses to effect the exposure and development by using a photosensitive film which includes a light-absorbing material. According to this method which employs an oil-soluble dye, however, it is very difficult to decolor the dyes without affecting the photosensitive film. In the method disclosed in the above Japanese Patent Publication No. 51-37562, the substrate after development is subjected to the etching, and then the remaining photosensitive film is removed. If the film containing a light-absorbing material which is difficult to decolor is dyed, two colors are mixed together making it impossible to obtain a color filter having desired spectral characteristics.

The present invention features that use of the above-mentioned light-absorbing material enables the color to be completely removed, and particularly that use of a weakly alkaline aqueous solution enables the color to be completely removed even though such color may be difficult to be completely removed under ordinary conditions. Owing to the method of the present invention, it is allowed to make a color filter which is precisely dyed to a desired color having precise and fine patterns corresponding to desired patterns.

The invention is illustrated below in further detail with reference to embodiments.

EXAMPLE 1

Figure 6:
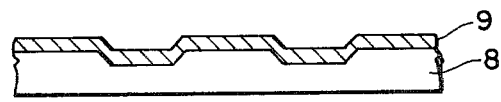
FIGS. 6, 7, 8, 9 and 10 are cross-sectional views of an element for illustrating an embodiment according to the present invention.
Figure 7:
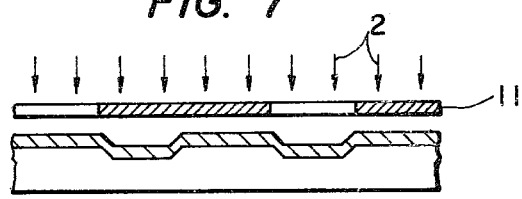
Figure 8:
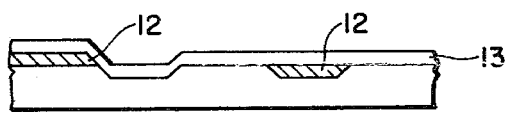
Figure 9:
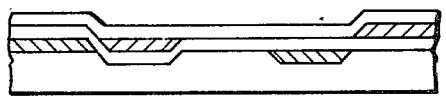
Figure 10:
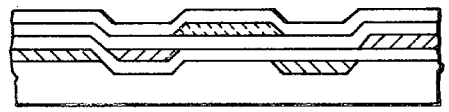

Tartrazine which is a light-absorbing agent is added in an amount of 3% with respect to gelatin to a water-soluble photoresist of the type of gelatin-ammonium dichromate. The mixture is then uniformly coated on a solid-state imager 8 having rugged surfaces to form a film 9 as shown in FIG. 6. The film 9 is dried and immediately thereafter, ray 2 having a wavelength of 435 nm is irradiated through a mask 11 onto the portions which exhibit a first color as shown in FIG. 6. Developing is then effected in hot water to remove unexposed portions of the photoresist. In this case, the Tartrazine is eluted out, and the gelatin film exhibits spectral transmittance characteristics which are the same as those of the gelatin films without admixed with Tartrazine. Then, the portions corresponding to the first color 12 are dyed with a dye having predetermined spectral characteristics thereby to prepare a color filter. Then, with reference to FIG. 8, a transparent intermediate layer 13 is coated to prevent colors from being mixed together. To prepare color filters having second and further colors, the operation as mentioned with reference to the formation of the first color should be repeated as illustrated in FIGS. 9 and 10.

EXAMPLE 2

The photosensitive film prepared in the same manner as in Example 1 is left to stand for a predetermined period of time, and is then exposed and developed. Since the photosensitive film is slightly colored, the film is immersed in an ammonia water of 0.1% for 30 seconds, washed with water and is dried. The Tartrazine is completely removed, and the photosensitive film exhibits spectral transmittance characteristics which are the same as those of the photosensitive films which do not contain Tartrazine and which are exposed and developed. The film is then dyed and is coated with an intermediate layer like Example 1. Color filters of the second and third color are then formed by repeating the same procedure.

The following experiment helps confirm that the light-absorbing material is also removed and color is extinguished when a weakly alkaline aqueous solution is used instead of ammonia water. Namely, a film is prepared from an aqueous solution of photosensitive resin composed of gelatin, ammonium dichromate (5% by weight with respect to gelatin) and Tartrazine (1.5% by weight with respect to gelatin), left to stand for 100 minutes, irradiated with light (70,000 luxes for 11 seconds), and is developed (in hot water maintained at 40° C. for 2 minutes). The film exhibits a transmittance of about 70% at around 415 nm, indicating that it is colored. When immersed in an aqueous solution of tetramethyl ammonium hydroxide (pH 12), in an aqueous solution of pyridine (pH 9.2), and in an aqueous solution of diethanol amine (pH 11.2), respectively, the color of the gelatin film is extinguished. Namely, the film exhibits the same spectral transmittance characteristics which are the same as those of the photosensitive resin which does not contain Tartrazine but which is exposed and developed.

According to the present invention as mentioned in the foregoing, the light transmittance of the photo-sensitive resin is decreased by adding a light-absorbing agent to the photosensitive resin, thereby to form fine patterns on the surface of a substrate which has a rugged surface and good reflection factor. Although the aforementioned embodiments have employed a photoresist of the type of gelatin-ammonium dichromate as the photosensitive resin, it is of course allowable to use a water-soluble photosensitive resin. Furthermore, the light-absorbing agent needs not be limited to the Tartrazine only, but those which absorb light while they are contained in the photosensitive resin and which can be removed by the developing after the patterns have been formed, can also be employed for the present invention.

What is claimed is:

1. A method of producing color filters comprising:
   a step for forming a photosensitive film by coating, on a substrate, a mixture which contains a water-soluble, negative-working photo-sensitive material and a water-soluble, light-absorbing material which absorbs light, which can be removed with a solvent and which can be dissolved in the photosensitive material;
   a step for irradiating light onto the photosensitive film through a predetermined pattern;
   a step for removing dissolvable portions of the photosensitive film and the light-absorbing material from the photosensitive film which remains on the substrate; and
   a step for dyeing the photosensitive film into any desired color.

2. A method of producing color filters according to claim 1, wherein said light-absorbing material is mixed to said photosensitive material in such an amount that the transmittance of light is smaller than 80% but is greater than 20%.

3. A method of producing color filters according to claim 1 or 2, wherein said light-absorbing material is comprised of at least one dye selected from the group consisting of direct dye, acid dye, basic dye, mordant dye and reactive dye.

4. A method of producing color filters according to claim 1, wherein said water-soluble negative-working photosensitive material is a gelatin-dichromate admixture.

5. A method of producing color filters according to claim 1, wherein the removal of dissolvable portions of said photosensitive material and the removal of said light-absorbing material are simultaneously carried out in hot water.

6. A method of producing color filters according to claim 1 or 2, wherein said substrate is a solid-state imager.

7. A method of producing color filters according to claim 1, wherein the light-absorbing material is removed with a weakly alkaline aqueous solution.

8. A method of producing color filters according to claim 7, wherein said light-absorbing material is removed after the dissolvable portions of said photosensitive film have been removed.

9. A method of producing color filters according to claim 7, wherein said weakly alkaline aqueous solution has a pH value over a range of from 7.1 to 12.0.

10. A method of producing color filters according to claim 7 or 8, wherein said light-absorbing material is mixed to said photosensitive material in such an amount that the transmittance of light is smaller than 80% but is greater than 20%.

11. A method of producing color filters according to any one of claims 7 to 9, wherein said light-absorbing material is comprised of at least one dye selected from the group consisting of direct dye, acid dye, basic dye, mordant dye and reactive dye.

12. A method of producing color filters according to any one of claim 7 to 9, wherein said water-soluble negative-working photosensitive material comprises a gelatin-dichromate admixture.

13. A method of producing color filters according to any one of claims 7 to 9, wherein said substrate is a solid-state imager.

14. A method of producing color filters according to claim 1, wherein said light-absorbing material is a material capable of absorbing a part of light having wavelengths ranging from 350 to 450 nm.

15. A method of producing color filters according to claim 1, wherein said light-absorbing material comprises at least one dye selected from the group consisting of direct dye, acid dye, basic dye, mordant dye and reactive dye, and said photosensitive material comprises a photoresist containing a mixture of a water-soluble polymer and a crosslinking agent for said polymer.

16. A method of producing color filters according to claim 15, wherein said water-soluble polymer comprises gelatin or polyvinyl alcohol and the crosslinking agent comprises ammonium dichromate or bisazide.

* * * * *